United States Patent [19]
White

[11] Patent Number: 5,534,810
[45] Date of Patent: Jul. 9, 1996

[54] POWER STAGE BIAS CIRCUIT WITH IMPROVED EFFICIENCY AND STABILITY

[75] Inventor: Charles M. White, Noblesville, Ind.

[73] Assignee: Thomson Consumer Electronics, Inc., Indianapolis, Ind.

[21] Appl. No.: 366,295

[22] Filed: Dec. 28, 1994

[51] Int. Cl.⁶ .................. H03K 19/084; H03K 19/094
[52] U.S. Cl. ................ 327/308; 327/108; 327/112; 327/311; 327/320; 327/344
[58] Field of Search ................ 327/108, 112, 327/311, 320, 308, 344

[56] References Cited

PUBLICATIONS

IBM Tech Disc. Bul "An All NPNAB Biased Output Stage", R L Killorn vol. 20 No. 7 Dec. 1977 pp. 2825–2826.

*Primary Examiner*—Margaret Rose Wambach
*Attorney, Agent, or Firm*—Joseph S. Tripoli; Joseph J. Laks; Harvey D. Fried

[57] ABSTRACT

A driver circuit especially for driving scan velocity modulation (SVM) coils or similar loads is characterized by low quiescent current loading and high peak output. The driver is coupled to an input signal varying between a quiescent signal level and a peak signal level. A transistor is coupled to a power supply and to the input signal, so as to conduct according to the input signal. A nonlinear element such as a diode is coupled in series with the emitter-collector junction of the transistor, and is biased to a voltage slightly less than a forward biased conducting diode voltage drop. Thus the diode has a higher resistance when the transistor is conducting at the quiescent signal level, and a lower resistance when the transistor is conducting at the peak signal level. The quiescent bias conditions are maintained by resistors in series and parallel with the diode. The driver may be configured as a complementary push-pull stage.

19 Claims, 3 Drawing Sheets

POWER STAGE BIAS CIRCUIT WITH IMPROVED EFFICIENCY AND STABILITY

BACKGROUND OF THE INVENTION

1. Field of the Invention

The invention relates to the field of driver circuits, especially balanced driver stages having push-pull transistors as used to drive television scan velocity modulation (SVM) coils and similar loads.

2. Description of Related Art

Driver circuits such as television scan velocity modulation (SVM) driver stages, also referred to as beam scan velocity modulation (BSVM), frequently use push-pull transistor current source circuits to drive SVM coils on the picture tube with a current signal derived from the video signal being displayed. The SVM coils can be driven directly in one output amplification stage, or a somewhat lower power push-pull transistor current source driver can be coupled to a higher power stage such as a push-pull emitter follower that drives the SVM coil.

The SVM coil is driven to produce a magnetic field to supplement the main deflection fields for modulating beam scanning velocity in a manner that enhances the sharpness of transitions in video luminance. For example at transitions between dark and light areas, the beam is passed more slowly across the lighter area on the display, which appears brighter that it would otherwise, and more quickly across the darker part. The SVM drive signal is derived in part from the derivative of the luminance component of the video signal and also can be modulated by horizontal and vertical rate parabolas such that the effect on picture sharpness is equal at different positions on the display.

An SVM driver stage typically has sufficient power to drive currents at least on the order of ±1 amp and voltages on the order of ±50 volts in the SVM coil. The SVM driver must also function at video frequencies, for example up to 10 MHz for conventional NTSC, higher for noninterlaced scanning, and up to 40 MHz for high definition television.

FIG. 1, labeled as prior art, is a schematic representation of a conventional push-pull current driver output stage, as might drive an SVM coil. The SVM coil or other load 20 is to be driven from a DC power source Vdc according to an AC input signal Vac, which is AC coupled by capacitors C1 and C2 to the bases of complementary push-pull transistors Q1 and Q2. Transistors Q1 and Q2 are respectively NPN and PNP transistors and are operated oppositely. When transistor Q1 is off, transistor Q2 is on and provides current from source Vdc to the load, charging capacitor C3. When transistor Q2 is off, transistor Q1 is on and discharges capacitor C3 through the load. Resistors R1 through R6 provide bias. Capacitor C3, in series with the load, develops an average DC value such that the load can be driven at opposite polarities.

Driver stages of this type have high peak power requirements, but efficiency requires careful control of the DC collector current bias that flows through transistors Q1 and Q2. It is also advantageous to minimize distortion of the waveform. These interests lead to conflicting design requirements for the circuit.

A DC collector current bias is desirable through transistors Q1 and Q2, including some current conduction through the respective transistor Q1 or Q2 when it is quiescent, i.e., "off." This bias current preserves the small signal frequency response of the circuit and tends to reduce distortion of the signal through the stage. The quiescent collector current bias is typically on the order of 10 mA. Apart from avoiding distortion effects, it is generally not desirable to have unnecessary DC quiescent current draw, because this contributes directly to the quiescent power dissipation of the stage as a whole.

The DC supply voltage "Vdc" is typically about +140 volts DC. Assuming 10 mA quiescent collector current, the quiescent bias current causes power dissipation of about 1.4 watts (0.7 watts per transistor). At 50 mA, the quiescent power dissipation would be 7 Watts for the two transistors (3.5 watts each).

Despite the high peak power requirements needed to drive an SVM coil, the actual duty cycle is generally low. In some cases the duty cycle is controlled by feeding back a signal representative of the output stage supply current or power, which reduces the SVM signal amplitude for the relatively rare instances when higher power is called for. Thus, an efficient design takes advantage of the relatively low SVM duty cycle and sizes the output stage accordingly. It also is appropriate to minimize quiescent power dissipation in the push-pull current driver to avoid wasting power and to avoid the need for overly large heat sinks.

The conventional circuit of FIG. 1 is not particularly advantageous for controlling the quiescent DC current bias in transistors Q1 and Q2 (especially with changes in temperature of the transistors), because design choices for better limiting quiescent current have adverse operational effects. For example, resistors R5 and R6, in series with transistors Q1 and Q2, could be made large to obtain low quiescent current. Larger resistors provide a larger voltage drop as compared to the base-emitter voltages of the transistors, and thus reduce quiescent current dependence on Vbe and temperature. Alternatively or in addition, the remaining resistors R1 through R4 used to bias transistors Q1 and Q2 could be chosen to minimize quiescent current. If the designer chooses to make resistors R5 and R6 larger, excessively large resistor values may be needed. If the designer chooses to vary the bias via resistors R1 through R4 (i.e., to reduce quiescent current by making resistors R2, R3 larger, and resistors R1, R4 smaller), small signal response would suffer and cross-over distortion would be introduced.

For example, assuming that resistors R5 and R6 are to be sized to develop 0.5 volts at 10 mA quiescent loading for good temperature stability, their values would be 50 ohms. This is acceptable during quiescent conditions, but at ±1 amp peak drive current, resistors R5, R6 would develop a 50 volt peak drop. High power resistors would be needed. Moreover, it would be necessary to increase the supply voltage Vdc by as much as 100 volts to keep a high available peak voltage across the load in view of the voltage drop across the respective resistor R5 or R6. This solution for quiescent current limiting is incompatible with peak voltage and power dissipation requirements.

A possible refinement to the circuit of FIG. 1 is to add two Vbe compensating diodes, as shown in the emitter follower version of FIG. 2, also labeled as prior art. Where possible, the same reference designations are used in the respective figures to identify the same functional elements. One diode CR1 conducts in series with resistor R1 and one in series with resistor R4. The diode junction voltages are expected to match and compensate the base-emitter voltages of transistors Q1 and Q2. This is an improvement, but it does not eliminate problems associated with biasing the driver stage. For optimal performance and electrical efficiency it is necessary to match the diode junction voltages accurately to the transistor base-emitter voltages. The diodes must be thermally coupled to the heat sinks of transistors Q1 and Q2 to remain matched for tracking during thermal changes. Voltage matching can be improved by adjusting the current through the diodes or specifying a certain junction voltage of the diodes, but these techniques add to the cost of the circuit, as do the structures and manufacturing steps needed to accomplish thermal coupling of the diodes to the transistors.

Without special junction voltage matching and/or thermal tracking, a junction voltage mismatch can arise, especially with normal production variations. This mismatch can be on the order of ±100 mV, which is substantial because it requires a quiescent DC Voltage across resistors R1 and R4 of at least 200 mV for good repeatability and reasonable thermal stability. Resistors R5 and R6 then need to be 20 ohms for the case of a design center quiescent collector current of 10 mA. Quiescent current also could vary from 5 mA to 20 mA, given the assumed degree of mismatch. At ±1 amp output, resistors R5 and R6 would develop a peak voltage of 20 volts. This is an improvement over the original version of FIG. 1, wherein resistors R5, R6 developed a 50 volt peak, but still is inefficient.

The circuit of FIG. 2 represents a conventional audio driver having a push-pull emitter follower output stage. Although configured as an emitter follower, this circuit has the same limitations discussed above, including problems with maintaining low quiescent bias, bias stability, junction voltage matching, and relative inefficiency or less than optimal output drive voltage capability.

SUMMARY OF THE INVENTION

It would be advantageous to resolve the conflicts between the need to maintain a low and stable quiescent bias and the need for a high peak output. Preferably, the solution would not rely on close component specification, thermal coupling arrangements, high power resistors or other drawbacks of the conventional circuits of FIGS. 1 and 2. According to the invention the resolution is achieved using a nonlinear element such as a diode in series with the emitter of a drive transistor. The circuit is biased to place only a small forward voltage across the diode in the quiescent state, namely slightly less than its fully conducting diode voltage drop, in which state the diode has a relatively higher resistance. At peak load the resistance of the diode is lower, thus achieving both low quiescent current and high peak drive voltage.

According to an inventive arrangement, the quiescent current draw of each side of a preferably complementary push-pull driver stage is reduced by providing nonlinear elements, in particular diodes, in series with the emitter-collector junctions of the transistors in the stage. The diodes are biased such that in quiescent current conditions the diodes are forward biased by slightly less than their forward conduction voltage. The diodes effectively have a high resistance in quiescent conditions, which minimizes quiescent current dissipation. The diodes present a relatively low resistance in peak current conditions, with a low voltage drop, thereby applying a higher proportion of the available voltage to the load at peak current. The driver stage develops a very good ratio of peak current to quiescent current.

A driver circuit in accordance with an inventive arrangement comprises: means providing an input signal varying between a quiescent signal level and a peak signal level; a transistor coupled to a power supply and to the means providing the input signal, the transistor being arranged to conduct according to the input signal; and, biasing means including a nonlinear element coupled to the transistor, the nonlinear element having a higher resistance when the transistor is conducting at the quiescent signal level, and a lower resistance when the transistor is conducting at the peak signal level.

A driver circuit in accordance with another inventive arrangement comprises: first and second transistors coupled in a push-pull configuration, having respective bases coupled to an input signal, having respective and corresponding electrodes coupled to one another and to a load and having respective conductive paths in series with respective emitter-collector junctions; a nonlinear conductive device coupled in each of the respective conductive paths, each nonlinear device having conductive and substantially non conductive states, depending upon a threshold voltage across each nonlinear device; and, respective bias circuits for the nonlinear devices, each bias circuit establishing respective bias thresholds nearly equal to the threshold voltage when the first and second transistors are In quiescent states.

DETAILED DESCRIPTION OF THE PREFERRED EMBODIMENTS

Figure 3:
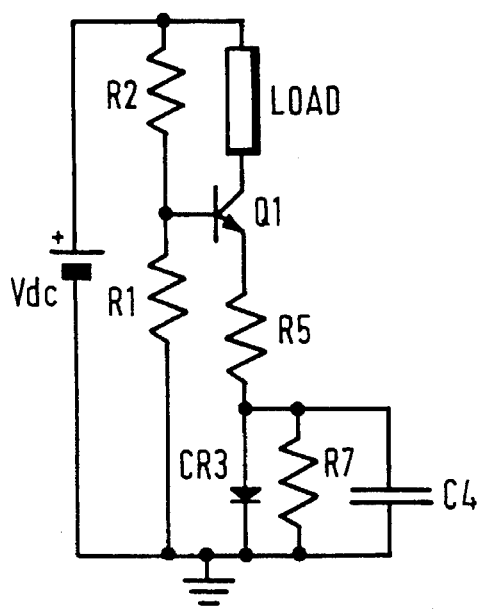
FIG. 3 is a schematic diagram of a driver stage bias circuit according to a first embodiment of the invention.
Figure 4:
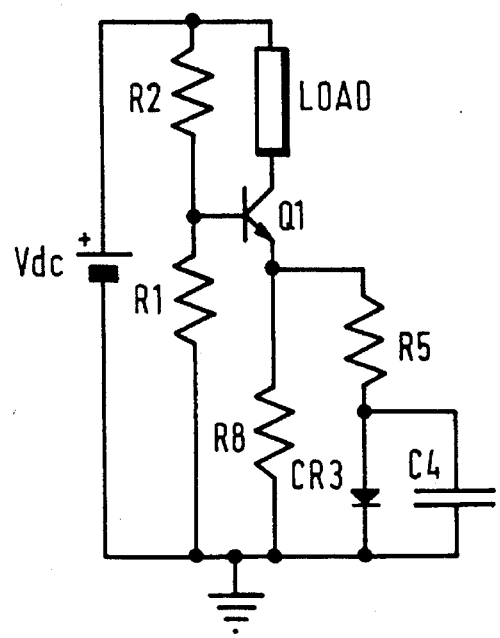
FIG. 4 is a schematic diagram showing an alternative embodiment.
Figure 5:
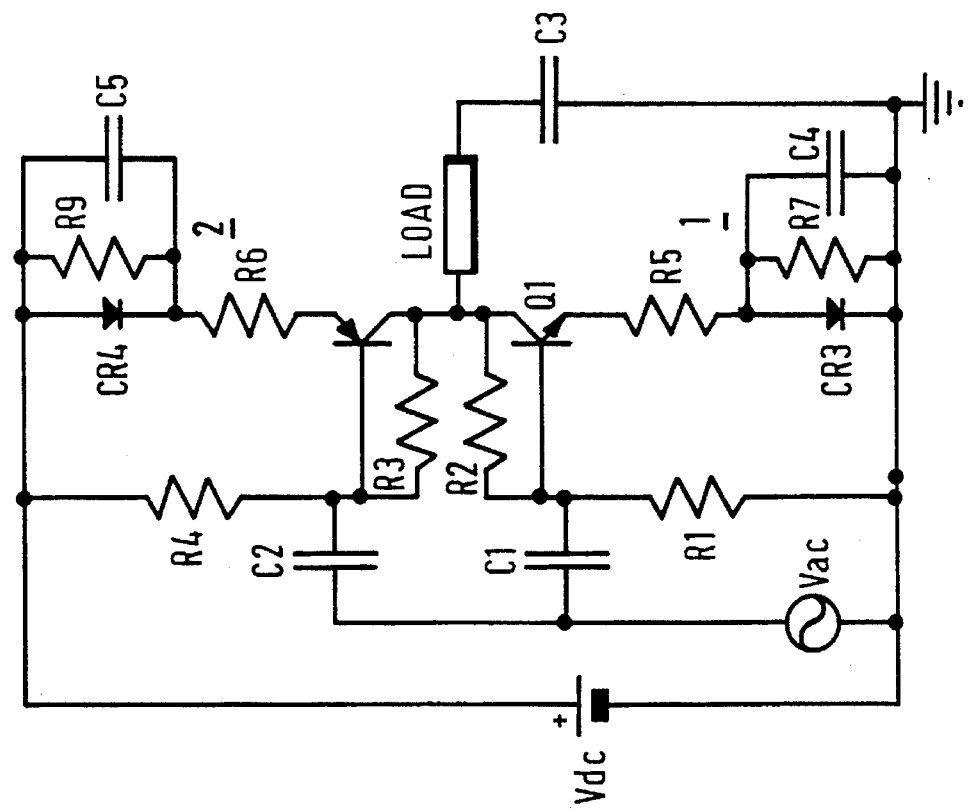
FIGS. 5 and 6 illustrate further embodiments corresponding to FIGS. 3 and 4, configured as push-pull drivers.
Figure 6:
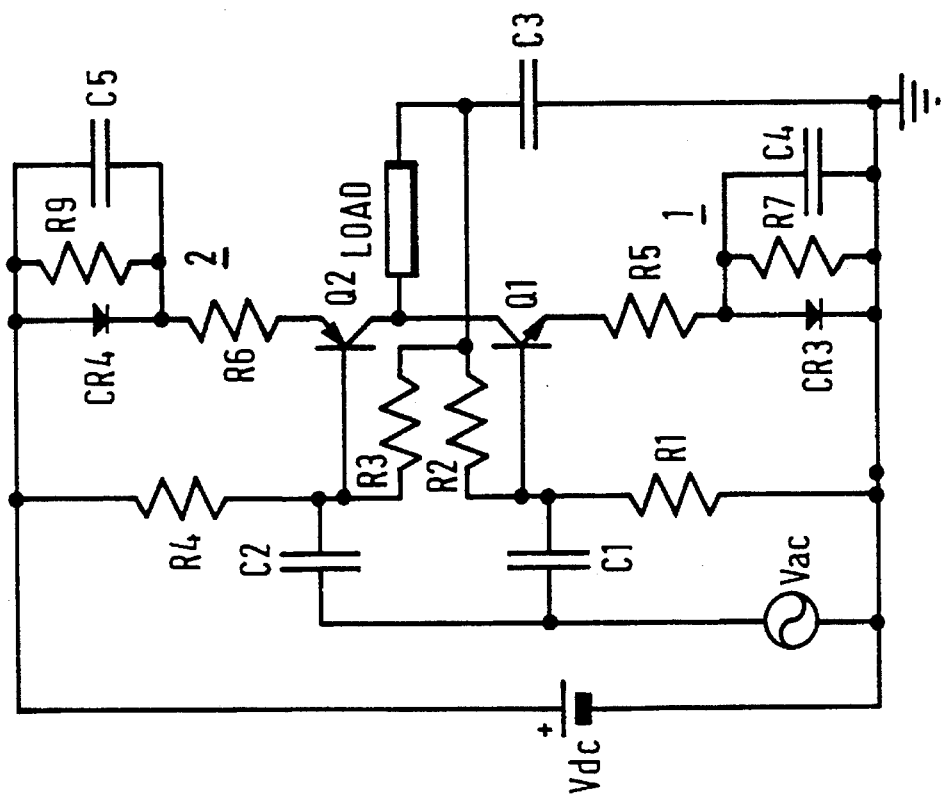

FIGS. 3 and 4 show two alternative forms of the driver stage according to the invention, including a diode CR3 in series with the emitter of an output transistor Q1, the same reference designations again being used to identify corresponding circuit elements. The circuits shown in FIGS. 3 and 4 represent circuit details for biasing one output transistor and can be repeated in a complementary manner for a complementary push-pull transistor arrangement as shown in FIGS. 5 and 6.

As shown in FIG. 3, a non-linear circuit or element CR3 is placed in series with the emitter of output transistor Q1 and is characterized by a relatively higher resistance at lower current levels, as occurring during quiescent bias conditions, and a relatively lower resistance for higher currents, as occurring during peak signal conditions. This is achieved by the biasing conditions on element CR3. The bias conditions for output transistor Q1 are determined by the choice of resistor values, such that a minimal quiescent current is maintained, e.g., 10 mA. However at quiescent current levels the voltage across the nonlinear element, namely diode CR1, is kept slightly below a forward biased conducting diode drop of about 0.7 volts that occurs across diode CR1 when conducting at peak current levels. Thus the resistance of diode CR1 is higher at quiescent current levels and lower at peak current levels.

For example, the value of resistor R7 can be 47 ohms and the value of resistor R5 can be 4.7 Ohms. For maintaining a minimal quiescent current level of 10 mA, which is appropriate to obtain a good low signal level response, the voltage at the emitter of transistor Q1 is 0.517 volts. Given a worse case tolerance of ±100 mV error in the base-emitter voltage of transistor Q1, the quiescent current only varies by approximately ±2 mA.

The purpose of CR1 in this circuit is to carry peak signal currents without introducing a substantial voltage drop, which would reduce the peak voltage output across the load, for example a scan velocity modulation coil of a television or similar display means. The values of resistors R5, R7 are chosen so that there is no significant conduction of diode CR1 at quiescent conditions of the stage, but the voltage across diode CR1 is reasonably close to the forward biased junction voltage of the diode.

Capacitor C4, in series with the emitter of transistor Q1 and in parallel with diode CR3, acts to carry high frequency (AC) emitter currents. Without diode CR3 present, large signal currents would charge capacitor C4 to a new DC condition that would significantly reduce the duty cycle of the emitter currents of transistor Q1, and in a push-pull arrangement as in FIGS. 5 and 6 would introduce significant amounts of "cross-over" distortion. Such distortion would increase as the average AC signal amplitude is increased. Diode CR3 acts to clamp the voltage on capacitor C4 at high average signal currents.

The circuit as shown does not absolutely eliminate crossover distortion, because the conducting junction voltage across diode CR3 is not exactly equal to the quiescent voltage across diode CR3. This is due to reasonable tolerances of junction voltages across diode CR3, ambient temperature shifts, and the diode's voltage/current conduction characteristics. However, distortion is minimal according to the invention, and far less than if diode CR3 is omitted. Crossover distortion can be reduced further, for example, by the usual technique of using overall feedback techniques and an input error amplifier (not shown) to more closely control the output current.

For a typical silicon rectifier diode as CR3, about 0.4 to 0.5 volts is optimum for the quiescent voltage across the diode. This is low enough for good stability in the bias of transistor Q1 at reasonable ambient temperatures, and prevents diode CR3 from conducting substantial quiescent current that would increase quiescent collector current in transistor Q1. The quiescent bias of 0.4 to 0.5 volts on diode CR3 is also close to its conduction voltage and therefore high enough for the high signal current conduction through diode CR3.

FIGS. 3 and 4 represent two alternative configurations, each of which can be used in a push pull arrangement as shown in FIGS. 5 and 6. In each case diode CR3 (and CR4 in FIGS. 5 and 6) is in series with its respective output transistor Q1 (and Q2). Current is coupled to the diode through series resistor R5. Resistor R7 in FIGS. 3 and 5 forms a voltage divider that determines the voltage across substantially non-conducting diode CR3 at quiescent current levels; and in FIGS. 4 and 6, this voltage is determined substantially by the value of resistor R8.

As shown in FIGS. 5 and 6, the driver stages of FIGS. 3 and 4 can be applied directly to a push pull output stage. Thus the input signal Vac is AC coupled by capacitors C1, C2 to the bases of complementary NPN and PNP transistors Q1, Q2. Diodes CR3 and CR4 are each biased by their respective series and parallel resistors R5, R7 or R6, R9 so as not to conduct substantially at quiescent current levels. At high current, conduction is through series coupled diodes CR3, CR4 and their resistors R5, R6, respectively. In FIG. 5, the bases of transistors Q1, Q2 are coupled by resistors R1, R2 or R3, R4 to capacitor C3, which is in series with the load and is charged through the load when transistor Q2 conducts and discharged through the load when transistor Q1 conducts, generally maintaining an average voltage of about half of the supply voltage Vdc. In FIG. 6, resistors R2 and R3 are coupled between the transistor bases and the load, with a similar effect.

Figure 7:
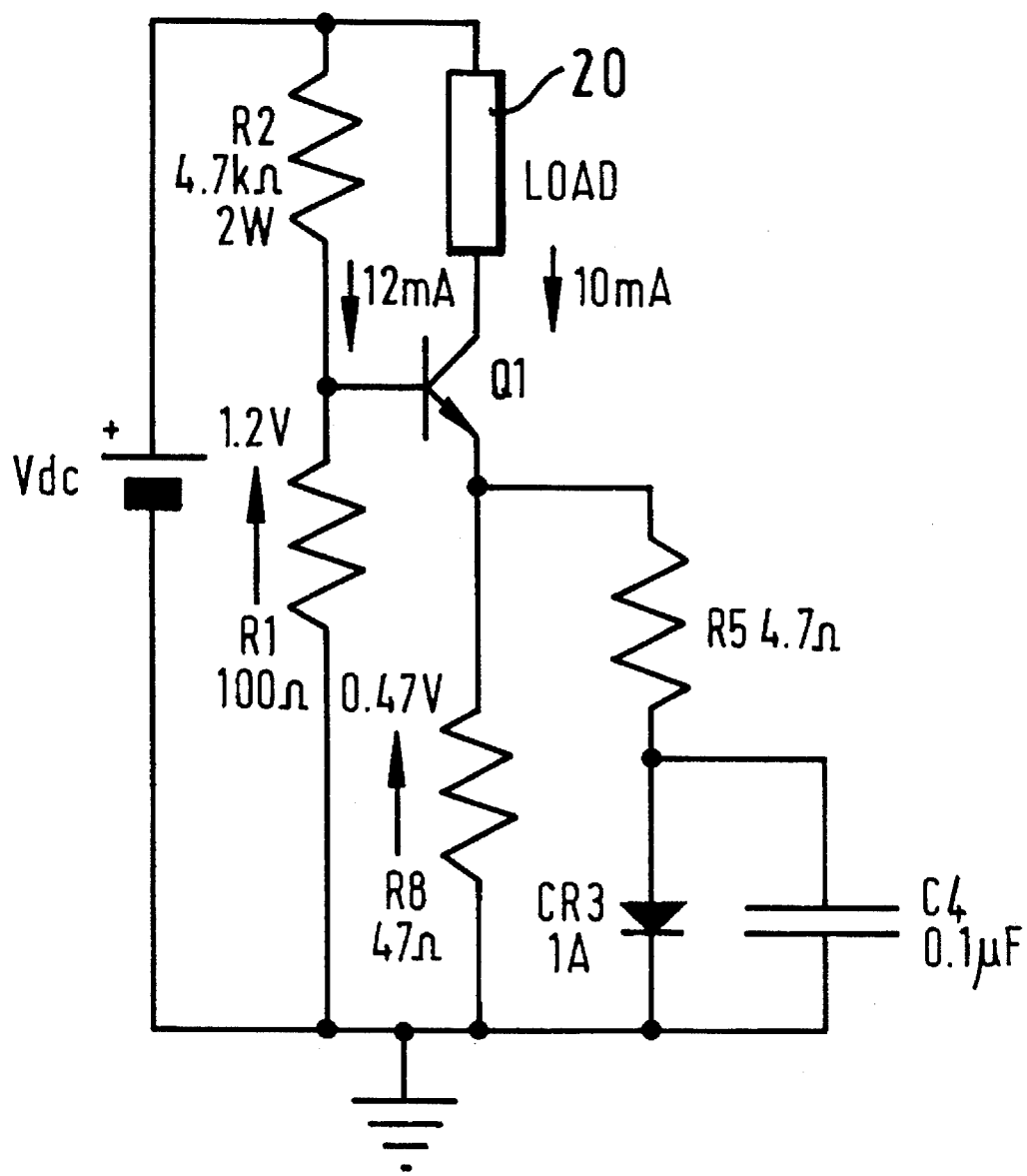
FIG. 7 is a schematic diagram illustrating a practical embodiment according to FIG. 4, including component values and resulting current levels and voltage drops.

FIG. 7 shows a driver stage according to the invention, with particular component values and corresponding quiescent current levels labeled. This embodiment can likewise be arranged in a push-pull complementary configuration as described.

Figure 1:
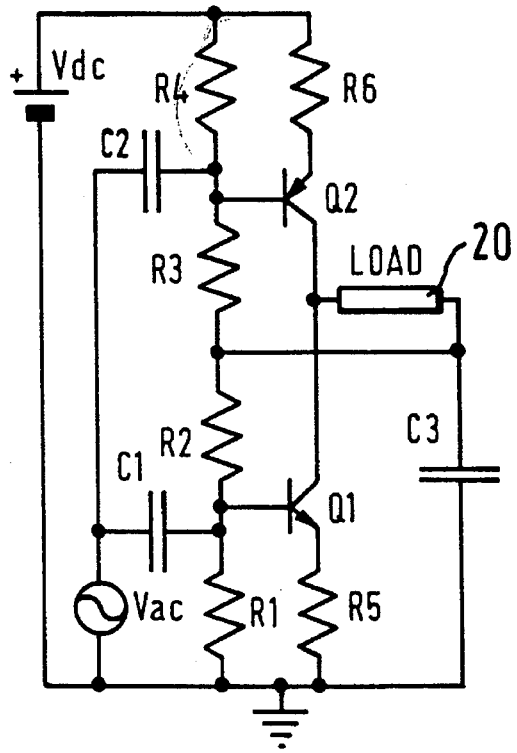
FIGS. 1 and 2, labeled as prior art, are schematic diagrams showing conventional push-pull drive circuits, FIG. 2 being configured as a push-pull emitter follower.
Figure 2:
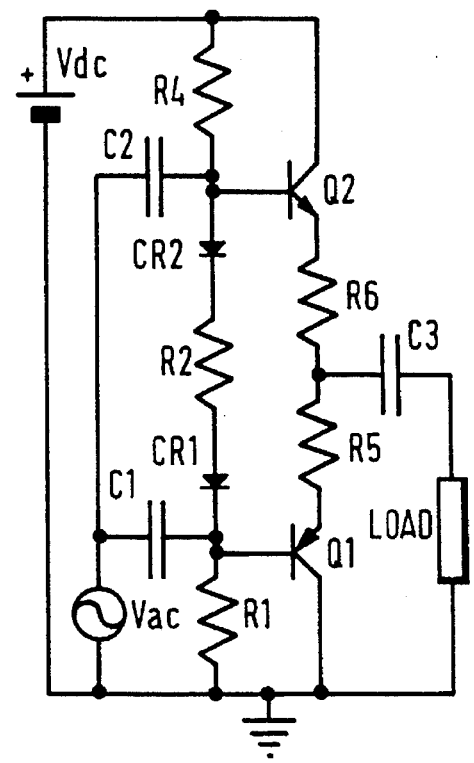

It will be appreciated by those skilled in the art that the invention shown in FIGS. 3–7 can also be utilized in push-pull amplifiers in which the emitters of the push-pull transistors are coupled to one another and coupled to a load, such as the classic audio amplifier configuration shown in FIG. 2.

The invention achieves a good degree of bias stability in a push-pull stage at low current levels and good power efficiency for peak signal currents. The invention is particularly advantageous for scan velocity modulation coil drivers and other drivers where the peak currents are many, many times larger than the quiescent bias currents. Cross-over distortion, while not perfect, is acceptable for many applications such as SVM drivers and can be significantly reduced by use of overall feedback and an error amplifier for causing the driver stage to more accurately track the input signal. The bias circuit also can be applied to the emitter circuits of other drivers, for example the driver stages of an audio amplifier or other voltage output stage wherein the same objectives of stable low quiescent collector current bias conditions and high electrical efficiency or high power drive capabilities are desirable.

What is claimed is:

1. A beam scan velocity modulation driver circuit, comprising:

first and second transistors coupled in a push-pull configuration, having respective signal input electrodes coupled for receiving a beam scan velocity modulating signal having a video bandwidth, having respective and corresponding electrodes coupled to one another and to a beam scan velocity modulating coil and having respective main conductive paths; and, respective bias circuits coupled to said main conductive paths of said transistors, including nonlinear devices having conductive states and substantially non conductive states depending upon a threshold voltage, said bias circuits establishing respective bias thresholds nearly equal to said threshold voltage when said first and second transistors are in quiescent states.

2. The driver circuit of claim 1, wherein each said nonlinear device comprises a diode coupled in series with one of said main conductive paths.

3. The driver circuit of claim 2, further comprising a first resistor in parallel with each said diode and a second resistor in series with each said diode.

4. A driver circuit, comprising:

means providing an input signal varying between a quiescent signal level and a peak signal level;

a transistor coupled to a power supply and to the means providing the input signal, the transistor being arranged to conduct according to the input signal;

a diode coupled in series with an emitter of the transistor, the diode having a higher resistance when the transistor is conducting at the quiescent signal level, and a lower resistance when the transistor is conducting at the peak signal level;

a first resistor in parallel with the diode and a second resistor in series with the diode, for maintaining a bias voltage across the diode at the quiescent signal level, said bias voltage being less than a forward biased conducting voltage of the diode; and, a capacitor coupled in parallel with the first resistor.

5. A driver circuit, comprising;

means providing an input signal varying between a quiescent signal level and a peak signal level;

two complementary transistors coupled to a power supply and to the means providing the input signal, the complementary transistors being arranged in a push-pull arrangement;

means for biasing the transistors, including diodes respectively coupled in series with an emitter of each of the transistors, and respective resistors at least partly in parallel with each of the diodes to maintain a quiescent voltage across each of the diodes which is less than a forward biased conducting voltage drop across each of the diodes; and, each said diode presenting a relatively, larger resistance when biased at the quiescent voltage at the quiescent signal level, and a relatively smaller resistance when the respective transistor is conducting through said diode.

6. The driver circuit of claim 5, wherein the transistors have collectors coupled to one another, and further comprising a load circuit coupled to the collectors, the load circuit including a load element and a capacitor in series, whereby the capacitor is charged through the load by one of the transistors and discharged through the load by the other of the transistors.

7. The driver circuit of claim 6, wherein the load element comprises a scan velocity modulation coil.

8. A driver circuit, comprising:

two complementary transistors, each having a base coupled to means for producing an input signal and another electrode coupled to a load element and to a corresponding electrode of the other said transistor such that the transistors operate alternately to conduct current to and from the load element;

means for biasing the transistors, including diodes respectively coupled in series with an emitter of each of the transistors, and resistors operable to maintain a quiescent voltage across the diode that is less than a forward biased conducting voltage drop of the diode; and, each said diode presenting a relatively larger resistance when biased at the quiescent voltage and a relatively smaller resistance when the respective transistor is conducting through said diode.

9. The driver circuit of claim 8, wherein said corresponding electrodes are collectors.

10. The driver circuit of claim 8, wherein the load element is a scan velocity modulation coil.

11. The driver circuit of claim 8, wherein the resistors include first resistors in parallel with the diodes; and second resistors in series with the diodes and with the emitters of the respective transistors.

12. A driver circuit, comprising:

first and second transistors coupled in a push-pull configuration, having respective bases coupled to an input signal, having respective and corresponding electrodes coupled to one another and to a load and having respective conductive paths in series with respective emitter-collector junctions;

a nonlinear conductive device coupled in each of said respective conductive paths, each said nonlinear device having conductive and substantially non conductive states, depending upon a threshold voltage across each said nonlinear device; and, respective bias circuits for said nonlinear devices, each said bias circuit establishing respective bias thresholds nearly equal to said threshold voltage when said first and second transistors are in quiescent states.

13. The circuit of claim 12, wherein said nonlinear conductive devices are diodes.

14. The circuit of claim 12, wherein said load comprises a beam scan velocity modulation coil.

15. The circuit of claim 12, further comprising a source of a beam scan velocity modulating signal for generating said input signal.

16. The circuit of claim 12, wherein said corresponding electrodes are collectors.

17. A beam scan velocity modulation driver circuit, comprising:

first and second transistors coupled in a push-pull configuration, having respective signal input electrodes coupled for receiving a beam scan velocity modulating signal having a video bandwidth, having respective and corresponding electrodes coupled to one another and to a beam scan velocity modulating coil and having respective main conductive paths; and, respective bias circuits coupled to said main conductive paths of said transistors, including nonlinear devices having conductive states and substantially non conductive states depending upon a threshold voltage, said bias circuits establishing respective bias thresholds such that said nonlinear devices substantially limit main conductive path current of said first and second transistors in said quiescent states and carry peak signal currents without introducing a substantial voltage drop otherwise tending to limit peak drive voltage of said transistors.

18. The driver circuit of claim 17, wherein said bias thresholds are nearly equal to said threshold voltage when said first and second transistors are in quiescent states.

19. The driver circuit of claim 17, wherein each said nonlinear device comprises a diode coupled in series with one of said main conductive paths.

* * * * *